United States Patent
Chiang et al.

(10) Patent No.: US 9,536,032 B2
(45) Date of Patent: Jan. 3, 2017

(54) METHOD AND SYSTEM OF LAYOUT PLACEMENT BASED ON MULTILAYER GRIDLINES

(71) Applicant: TAIWAN SEMICONDUCTOR MANUFACTURING COMPANY, LTD., Hsinchu (TW)

(72) Inventors: Ting-Wei Chiang, New Taipei (TW); Li-Chun Tien, Tainan (TW); Hui-Zhong Zhuang, Kaohsiung (TW); Zhe-Wei Jiang, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/554,958

(22) Filed: Nov. 26, 2014

(65) Prior Publication Data

US 2016/0147926 A1 May 26, 2016

(51) Int. Cl.
*G06F 17/50* (2006.01)
*H03K 19/02* (2006.01)
*H01L 27/02* (2006.01)

(52) U.S. Cl.
CPC ....... *G06F 17/5072* (2013.01); *G06F 17/5068* (2013.01); *H03K 19/02* (2013.01); *H01L 27/0207* (2013.01)

(58) Field of Classification Search
CPC .. G06F 17/5072; G06F 17/5068; H03K 19/02; H01L 27/0207
See application file for complete search history.

(56) References Cited

U.S. PATENT DOCUMENTS

| | | | | |
|---|---|---|---|---|
| 6,453,447 B1 * | 9/2002 | Gardner | ............. | G06F 17/5068 716/103 |
| 6,862,723 B1 * | 3/2005 | Wang | ................. | G06F 17/5081 716/112 |
| 7,917,879 B2 * | 3/2011 | Becker | ............... | G06F 17/5068 716/119 |
| 8,173,491 B2 * | 5/2012 | Law | .................... | H01L 27/0207 438/128 |
| 8,214,778 B2 * | 7/2012 | Quandt | .............. | G06F 17/5068 716/100 |
| 8,247,846 B2 * | 8/2012 | Becker | .................... | G03F 1/144 257/211 |
| 8,276,105 B2 * | 9/2012 | Keinert | .............. | G06F 17/5072 716/119 |
| 8,878,303 B2 * | 11/2014 | Hatamian | .......... | G06F 17/5081 257/369 |
| 2009/0271753 A1 * | 10/2009 | Quandt | .............. | G06F 17/5068 716/119 |

(Continued)

*Primary Examiner* — Naum B Levin
(74) *Attorney, Agent, or Firm* — Hauptman Ham, LLP

(57) ABSTRACT

A method of forming a layout design for fabricating an integrated circuit is disclosed. The method includes identifying a line pattern of a first set of grid lines with respect to a second set of grid lines within a region of the layout design; and placing a k-th standard cell layout of the K standard cell layouts at the region of the layout design if the line pattern is determined to match a k-th predetermined line pattern of K predetermined line patterns. K is an integer equal to or greater than two, and k is an order index ranging from 1 to K. The region of the layout design is sized to fit one of K different standard cell layouts corresponding to a same standard cell functionality.

20 Claims, 7 Drawing Sheets

(56) References Cited

U.S. PATENT DOCUMENTS

2010/0155783 A1\* 6/2010 Law .................... H01L 27/0207
257/206
2015/0333008 A1\* 11/2015 Gupta .................. H01L 23/535
257/369

\* cited by examiner

METHOD AND SYSTEM OF LAYOUT PLACEMENT BASED ON MULTILAYER GRIDLINES

CROSS-REFERENCE

The present application relates to U.S. patent application Ser. No. 14/051,881, filed on Oct. 11, 2013, titled "STANDARD CELLS FOR PREDETERMINED FUNCTION HAVING DIFFERENT TYPES OF LAYOUT," and the disclosure of which is incorporated herein by reference in its entirety.

BACKGROUND

An integrated circuit (IC) is fabricated according to a layout design usable to form a plurality of masks for selectively forming or removing various layers of features, such as active regions, gate electrodes, various layers of isolation structures, and/or various layers of conductive structures. Many fabrication processes are available to increase the spatial resolution of various layers of features and thus allow layout patterns to have a finer spatial resolution requirement in a corresponding layout. Some approaches usable for increasing the spatial resolution include using one or more fabrication processes such as ultraviolet lithography, extreme ultraviolet lithography, electron-beam lithography, and/or multiple-patterning. In many applications, the finest available spatial resolutions of various layers are different.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
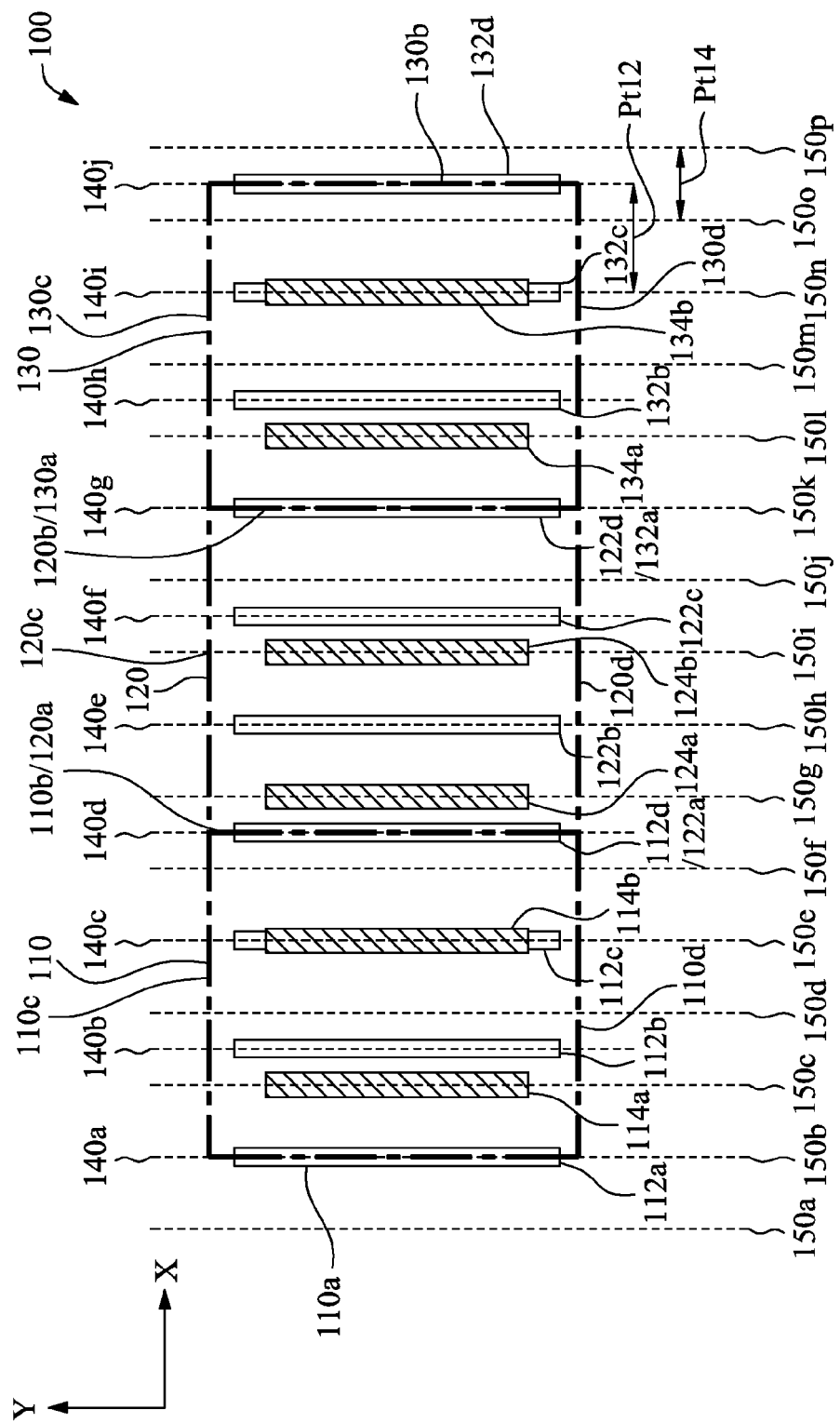
FIG. 1 is a diagram of a portion of a layout design showing standard cell layouts placed based on two sets of grid lines, which extend along a first direction, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the design of an integrated circuit, standard cells having predetermined functions are used. Pre-designed layouts of standard cells are stored in cell libraries. When designing an integrated circuit, the pre-designed layouts of the standard cells are retrieved from the cell libraries and placed into desired locations on an integrated circuit layout design. Routing is then performed to connect the standard cell layouts with each other by layout patterns corresponding to metal tracks. The integrated circuit layout design is thereafter used to manufacture the integrated circuit using a predetermined semiconductor manufacturing process. In some embodiments, a standard cell is a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, or clock cells.

In accordance with one or more embodiments of this disclosure, in order to accommodate different spatial resolutions of various component layers, a standard cell having a plurality of different standard cell layouts in a cell library. One of the plurality of different standard cell layouts is selected to be placed in a region of a layout design according to a grid line pattern of the region. The grid line pattern refers to various sets of grid lines each correspond to placement of layout patterns of different layout layers. Accordingly, a plurality of standard cell layouts of a same standard cell functionality is available for forming a layout design and thus is usable to avoid synchronizing the line patterns of the sets of grid lines by loosening one or more of the spatial resolutions of the corresponding component layers.

FIG. 1 is a diagram of a portion of a layout design 100 showing standard cell layouts 110, 120, and 130 placed based on two sets of grid lines 140a-140j and 150a-150p in accordance with some embodiments. The two sets of grid lines 140a-140j and 150a-150p extend along a direction Y. Three standard cell layouts 110, 120, and 130 are depicted in FIG. 1 as an example. In some embodiments, there are more or less than three standard cell layouts in a layout design. Moreover, details of standard cell layouts 110, 120, and 130 are simplified in order to facilitate the illustration of the present disclosure.

Standard cell layouts 110, 120, and 130 correspond to a same standard cell functionality and have the same size. In other words, standard cell layouts 110, 120, and 130 correspond to the same circuit from the circuit schematic perspective, have the same cell height and cell width in the layout design, but have different layout patterns. Standard cell layout 110 has cell boundaries 110a and 110b extending along direction Y and cell boundaries 110c and 110d extending along a direction X. Standard cell layout 110 has layout patterns 112a-112d and 114a-114b. Layout patterns 112a-112d are part of a first layout layer corresponding to fabricating components of a first component layer of the resulting integrated circuit. Layout patterns 114a-114b are part of a second layout layer corresponding to fabricating components of a second component layer of the resulting integrated circuit. In some embodiments, the first component layer and the second component layer each correspond to a different one of the following component layers of the integrated circuit: a gate structure layer; a first conductive layer over the gate structure layer; and a second conductive layer over the first conductive layer.

Standard cell layout 120 has cell boundaries 120a and 120b extending along direction Y and cell boundaries 120c and 120d extending along a direction X. Standard cell layout 120 has layout patterns 122a-122d corresponding to layout patterns 112a-112d and layout patterns 124a-124b corresponding to layout patterns 114a and 114b. Layout patterns 122a-122d are part of the first layout layer, and layout patterns 124a-124b are part of the second layout layer. Moreover, standard cell layout 130 has cell boundaries 130a and 130b extending along direction Y and cell boundaries 130c and 130d extending along a direction X. Standard cell layout 130 has layout patterns 132a-132d corresponding to layout patterns 112a-112d and layout patterns 134a-134b corresponding to layout patterns 114a and 114b. Layout patterns 132a-132d are part of the first layout layer, and layout patterns 134a-134b are part of the second layout layer.

Layout patterns 112a-112d, 122a-122d, and 132a-132d are placed to be aligned with corresponding grid lines 140a-140b. Layout patterns 114a-114b, 124a-124b, and 134a-134b are placed to be aligned with corresponding grid lines 150c, 150e, 150g, 150i, 150l, and 150m. In this disclosure, a layout pattern is aligned with a grid line if a center line of the layout pattern overlaps the grid line. In the embodiment depicted in FIG. 1, cell boundary 110b overlaps cell boundary 120a and grid line 140d, and layout patterns 112d and 122a are thus merged. Also, cell boundary 120b overlaps cell boundary 130a and grid line 140g, and layout patterns 122d and 132a are thus merged The set of gridlines 140a-140j has a line pitch Pt12. In some embodiments, line pitch Pt12 is set to minimize an area of the resulting integrated circuit permitted by a predetermined manufacturing process. In the present disclosure, such line pitch Pt12 is also referred to as an optimized fine pitch of the first layout layer. The set of gridlines 150a-150p has a line pitch Pt14. In some embodiments, line pitch Pt14 is set to minimize an area of the resulting integrated circuit permitted by the predetermined manufacturing process. In the present disclosure, such line pitch Pt14 is also referred to as an optimized fine pitch of the second layout layer. A ratio of line pitches Pt12 to Pt14 is 3:2.

The region occupied by standard cell layout 110 (which will also be referred to as region 110) has a first predetermined type of line pattern of the first set of grid lines 140a-140d with respect to the second set of grid lines 150b-150f. In the embodiment depicted in FIG. 1, the first predetermined type of line pattern corresponds to four grid lines 140a-140d of the first set of grid lines and five grid lines 150b-150f of the second set of grid lines arranged in a manner such that grid line 140a overlaps grid line 150b and the left cell boundary 112a of region 110. The region occupied by standard cell layout 130 (which will also be referred to as region 130) thus also has the first predetermined type of line pattern, because grid lines 140g-140j of the first set of grid lines and five grid lines 150k-150o of the second set of grid lines arranged in a manner such that grid line 140g overlaps grid line 150k and the left cell boundary 132a of region 130.

The standard cell layouts 110 and 130 are thus replicas of a first predetermined type of standard cell layout, which has corresponding layout patterns 112a-112d or 132a-132d and 114a-114b or 134a-134b placed based on the first predetermined type of line pattern.

The region occupied by standard cell layout 120 (which will also be referred to as region 120) has a second predetermined type of line pattern of the first set of grid lines 140d-140g with respect to the second set of grid lines 150g-150k. In the embodiment depicted in FIG. 1, the second predetermined type of line pattern corresponds to four grid lines 140d-140g of the first set of grid lines and five grid lines 150g-150k of the second set of grid lines arranged in a manner such that grid line 140g overlaps grid line 150k and the right cell boundary 122b of region 120.

The standard cell layout 120 is thus a replica of a second predetermined type of standard cell layout, which has corresponding layout patterns 122a-122d and 124a-124b placed based on the second predetermined type of line pattern.

In some embodiments, a line pattern of a first set of grid lines with respect to a second set of grid lines within a standard cell region corresponds to one of K10 different predetermined line patterns. K10 is an integer equal to or greater than two. K10 different standard cell layouts corresponding to a same standard cell functionality are designed based on the K10 different predetermined line patterns. Therefore, if a layout region has a line pattern matching a k10-th predetermined line pattern of K10 predetermined line patterns, a k10-th standard cell layout of the K10 standard cell layouts is placed at the region. The index "k10" is an order index ranging from 1 to K10.

In some embodiments, a ratio of the first line pitch, such as line pitch Pt12, to the second line pitch, such as line pitch Pt14, is M10:N10, where M10 and N10 are positive integers. The number K10 of different types of line pattern and/or the number K of different type of standard cell layout is determinable based on the equation:

$$K10 = \frac{L10}{M10},$$

where L10 is a least common multiple of M10 and N10. In some embodiments, the standard cell layouts are arranged in a manner such that two cell boundaries of the k10-th standard cell layout that extends along direction Y overlap two corresponding grid lines of the first set of grid lines.

In some embodiments, two of the K10 standard cell layouts are mirror-image counterparts of each other and still counted as two different types of standard cell layout in this disclosure.

Figure 2:
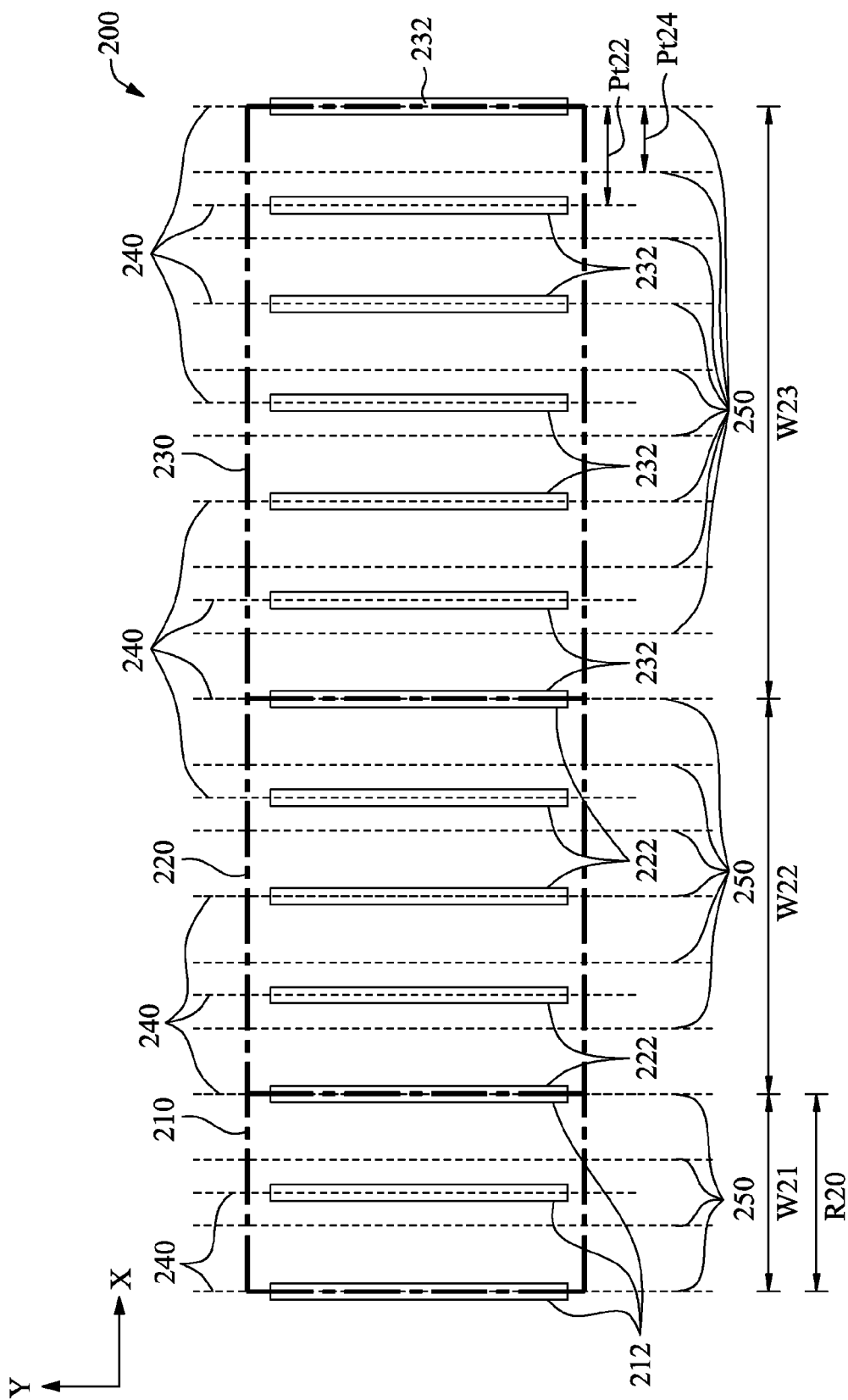
FIG. 2 is a diagram of a portion of another layout design showing standard cell layouts placed based on two sets of grid lines, which extend along a direction corresponding to the first direction of FIG. 1, in accordance with some embodiments.

FIG. 2 is a diagram of a portion of another layout design 200 showing standard cell layouts 210, 220, and 230 placed based on two sets of grid lines 240 and 250, which extend along direction Y, in accordance with some embodiments. Layout design 200 includes a set of layout patterns 212, 222, and 232 corresponding to layout patterns 112a-112d, 122a-122d, and 132a-132d in FIG. 1. The set of grid lines 240 has a line pitch Pt22, and the set of grid lines 250 has a line pitch Pt24. The sets of grid lines 240 and 250 and line pitches Pt22 and Pt24 correspond to the sets of grid lines 140a-140j and 150a-150p and line pitches Pt12 and Pt14 in FIG. 1. Detailed description of layout patterns 212, 222, and 232, grid lines 240 and 250, and line pitches Pt22 and Pt24 is thus omitted. Layout patterns placed to be aligned with one or more of grid lines 250 are omitted in FIG. 2 to avoid obstructing the illustration of grid lines and standard cell layouts 210, 220, and 230.

Compared with the embodiment in FIG. 1, standard cell layouts 210, 220, and 230 have different sizes. In some embodiments, standard cell layouts 210, 220, and 230 correspond to different standard cell functionalities, such as different logical functions or same logical function with different driving capabilities.

In the embodiment depicted in FIG. 2, a ratio of line pitches Pt22 to Pt24 is 3:2. Therefore, the line pattern of the two sets of grid lines 240 and 250 repeats every distance R20 corresponding to twice the line pitch Pt22 or thrice the line pitch Pt24. Therefore, some of the standard cell layouts usable in layout design 200 are arranged to have cell widths of integer multiple of distance R20. For example, standard cell layout 210 has a width W21 equal to a single distance R20; standard cell layout 220 has a width W22 equal to the double of distance R20; and standard cell layout 230 has a width W23 equal to the triple of distance R20. The cell widths are measurable along direction X.

In some embodiments, a ratio of the first line pitch, such as line pitch Pt22, to the second line pitch, such as line pitch Pt24, is M20:N20, where M20 and N20 are positive integers. Some of the standard cell layouts have cell widths being integer multiples of distance R20. Distance R20 is determinable based on the equation:

$$R20 = \frac{L20}{M20} \cdot Pt22,$$

where L20 is a least common multiple of M20 and N20.

In some embodiments, the first component layer and the second component layer each correspond to a different one of the following component layers of the integrated circuit: a fin structure layer for FinFETs; a first conductive layer over the fin structure layer; and a second conductive layer over the first conductive layer.

Figure 3:
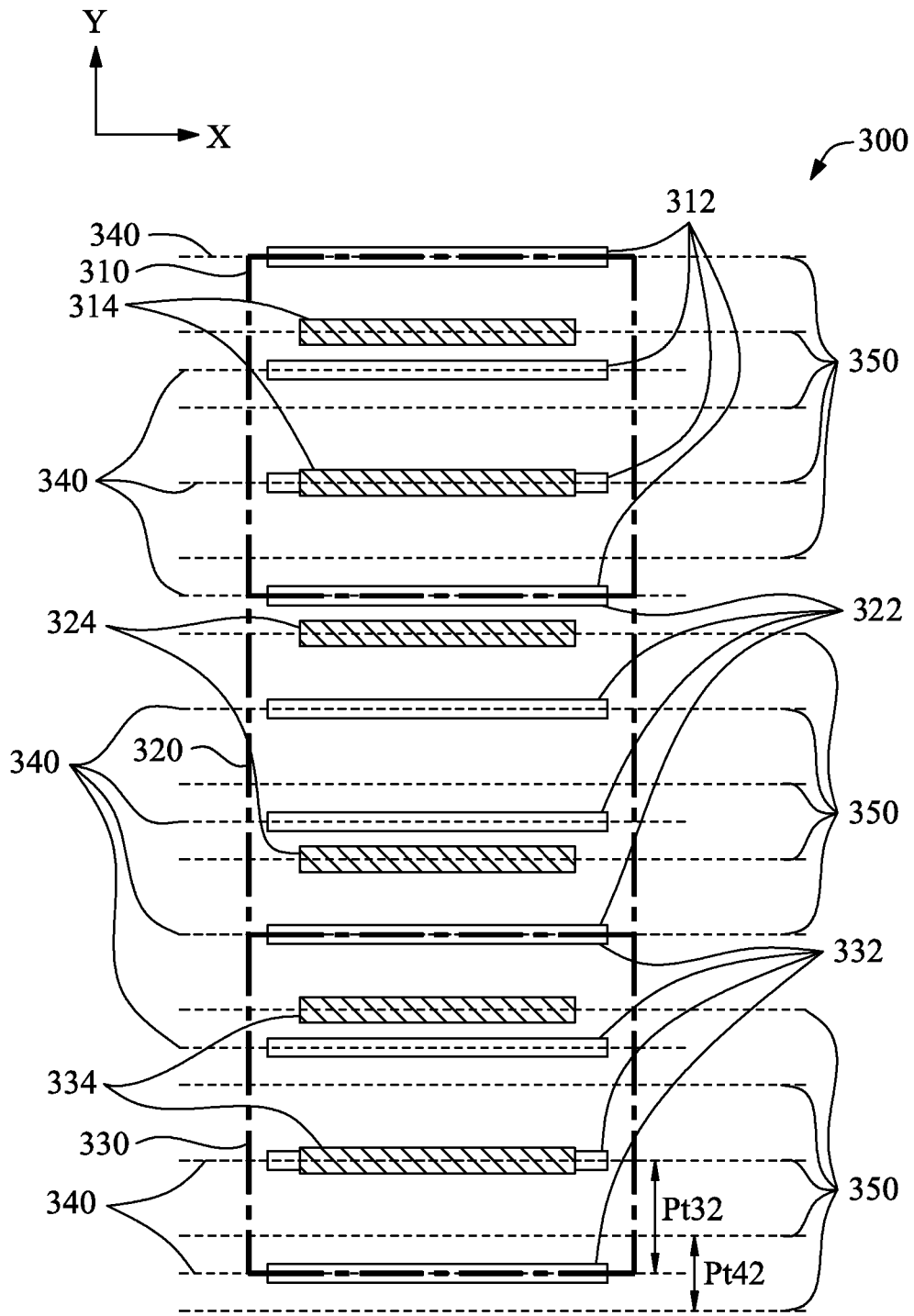
FIG. 3 is a diagram of a portion of yet another layout design showing standard cell layouts placed based on two sets of grid lines, which extend along a second direction, in accordance with some embodiments.

FIG. 3 is a diagram of a portion of yet another layout design 300 showing standard cell layouts 310, 320, and 330 placed based on two sets of grid lines 340 and 350, which extend along a direction X, in accordance with some embodiments. FIG. 3 depicts an embodiment similar to the embodiment of FIG. 1 except the relevant grid lines being along a different direction.

Layout design 300 includes a set of layout patterns 312, 322, and 332 corresponding to fabricating a third component layer of the integrated circuit and a set of layout patterns 314, 324, and 334 corresponding to fabricating a fourth component layer of the integrated circuit. Layout patterns 312, 322, and 332 are placed to be aligned with corresponding grid lines of the set of grid lines 340. Layout patterns 314, 324, and 334 are placed to be aligned with corresponding grid lines of the set of grid lines 350. The set of grid lines 340 has a line pitch Pt32, and the set of grid lines 350 has a line pitch Pt34. In some embodiments, the third component layer and the fourth component layer each correspond to a different one of the following component layers of the integrated circuit: a fin structure layer for FinFETs; a first conductive layer over the fin structure layer; and a second conductive layer over the first conductive layer.

Compared with grid lines 140a-140j and 150a-150p in FIG. 1, grid lines 340 and 350 extend along direction X rather than direction Y. A ratio of line pitches Pt32 to Pt34 is 3:2. The region occupied by standard cell layout 310 and standard cell layout 330 has a third predetermined type of line pattern of the set of grid lines 340 with respect to the set of grid lines 350 in a manner similar to the first predetermined type of line pattern advanced above in conjunction with FIG. 1. The standard cell layouts 310 and 330 are thus replicas of a third predetermined type of standard cell layout. The region occupied by standard cell layout 320 has a fourth predetermined type of line pattern of the set of grid lines 340 with respect to the set of grid lines 350 in a manner similar to the second predetermined type of line pattern advanced above in conjunction with FIG. 1. The standard cell layout 320 is thus a replica of a fourth predetermined type of standard cell layout.

In some embodiments, a line pattern of a third set of grid lines with respect to a fourth set of grid lines within a standard cell region corresponds to one of K30 different predetermined line patterns. K30 is an integer equal to or greater than two. K30 different standard cell layouts corresponding to a same standard cell functionality are designed based on the K30 different predetermined line patterns. Therefore, if a layout region has a line pattern matching a k30-th predetermined line pattern of K30 predetermined line patterns, a k30-th standard cell layout of the K30 standard cell layouts is placed at the region. The index "k30" is an order index ranging from 1 to K30.

In some embodiments, a ratio of the third line pitch, such as line pitch Pt32, to the fourth line pitch, such as line pitch Pt34, is M30:N30, where M30 and N30 are positive integers. The number K30 of different types of line pattern and/or the number K30 of different type of standard cell layout is determinable based on the equation:

$$K30 = \frac{L30}{M30},$$

where L30 is a least common multiple of M30 and N30. In some embodiments, the standard cell layouts are arranged in a manner such that two cell boundaries of the k30-th standard cell layout that extends along direction X overlap two corresponding grid lines of the third set of grid lines.

Figure 4:
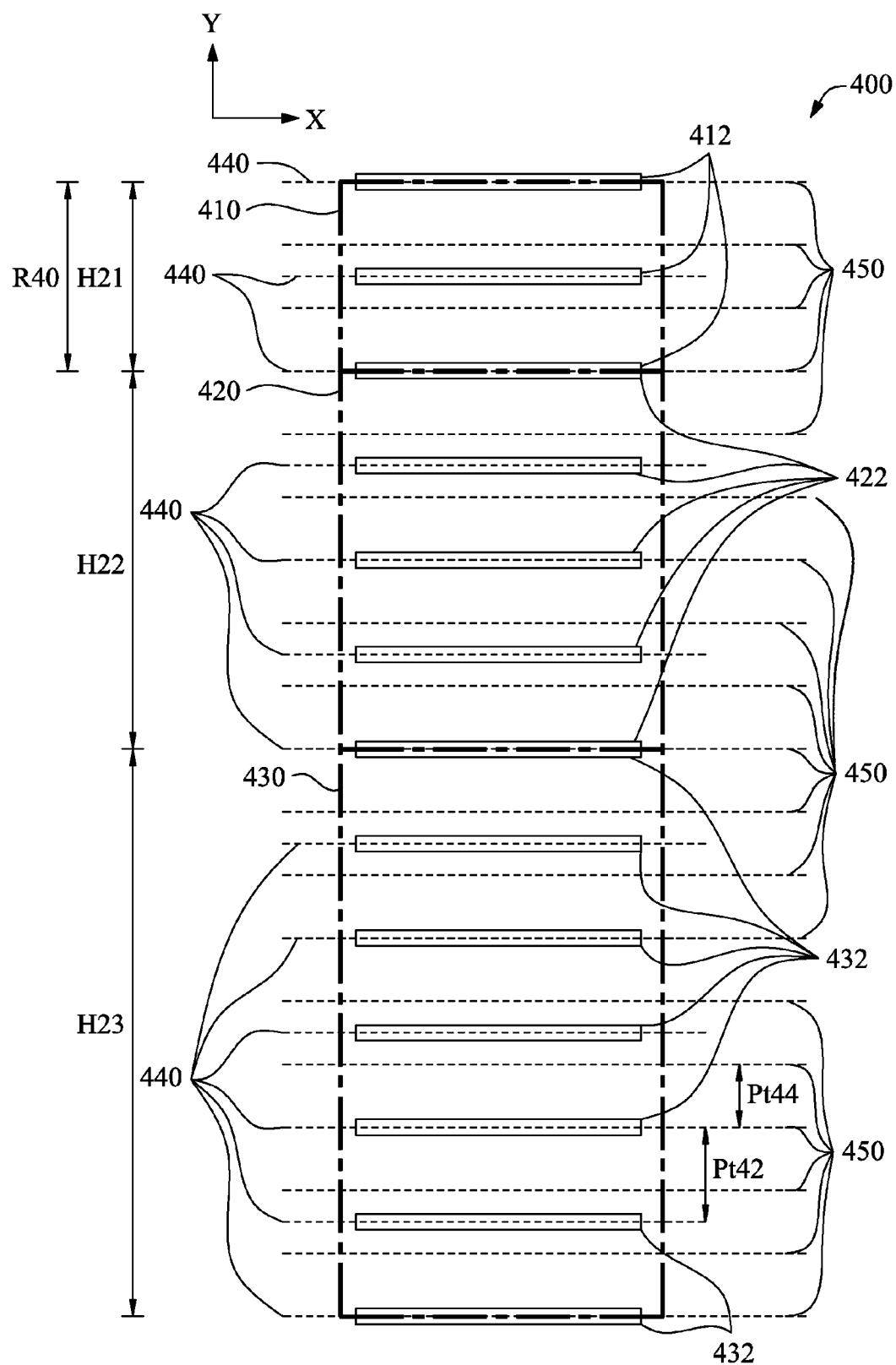
FIG. 4 is a diagram of a portion of yet another layout design showing standard cell layouts placed based on two sets of grid lines, which extend along a direction corresponding to the second direction of FIG. 3, in accordance with some embodiments.

FIG. 4 is a diagram of a portion of yet another layout design 400 showing standard cell layouts 410, 420, and 430 placed based on two sets of grid lines 440 and 450, which extend along direction X, in accordance with some embodiments. FIG. 4 depicts an embodiment similar to the embodiment of FIG. 2 except the grid lines being along a different direction.

Layout design 400 includes a set of layout patterns 412, 422, and 432 corresponding to layout patterns 312, 322, and 332 in FIG. 3. The set of grid lines 440 has a line pitch Pt42, and the set of grid lines 450 has a line pitch Pt44. The sets of grid lines 440 and 450 and line pitches Pt42 and Pt44 correspond to the sets of grid lines 340 and 350 and line pitches Pt32 and Pt34 in FIG. 3. Detailed description of layout patterns 412, 422, and 432, grid lines 440 and 450, and line pitches Pt42 and Pt44 is thus omitted. Layout patterns placed to be aligned with one or more of grid lines 350 are omitted in FIG. 3 to avoid obstructing the illustration of grid lines and standard cell layouts 410, 420, and 430.

Compared with the embodiment in FIG. 3, standard cell layouts 410, 420, and 430 have different sizes. In some embodiments, standard cell layouts 410, 420, and 430 correspond to different standard cell functionalities, such as different logical functions or same logical function with different driving capabilities.

In the embodiment depicted in FIG. 4, a ratio of line pitches Pt42 to Pt44 is 3:2. Therefore, the line pattern of the two sets of grid lines 440 and 450 repeats every distance R40 corresponding to twice the line pitch Pt42 or thrice the line pitch Pt44. Therefore, some of the standard cell layouts usable in layout design 400 are arranged to have cell heights of integer multiple of distance R40. For example, standard cell layout 410 has a height H21 equal to a single distance R40; standard cell layout 420 has a height H22 equal to the double of distance R40; and standard cell layout 430 has a height H23 equal to the triple of distance R40. The cell widths are measurable along direction Y.

In some embodiments, a ratio of the first line pitch, such as line pitch Pt42, to the second line pitch, such as line pitch Pt44, is M40:N40, where M40 and N40 are positive integers. Some of the standard cell layouts have cell heights being integer multiples of distance R40. Distance R40 is determinable based on the equation:

$$R40 = \frac{L40}{M40} \cdot Pt42,$$

where L40 is a least common multiple of M40 and N40.

Figure 5A:
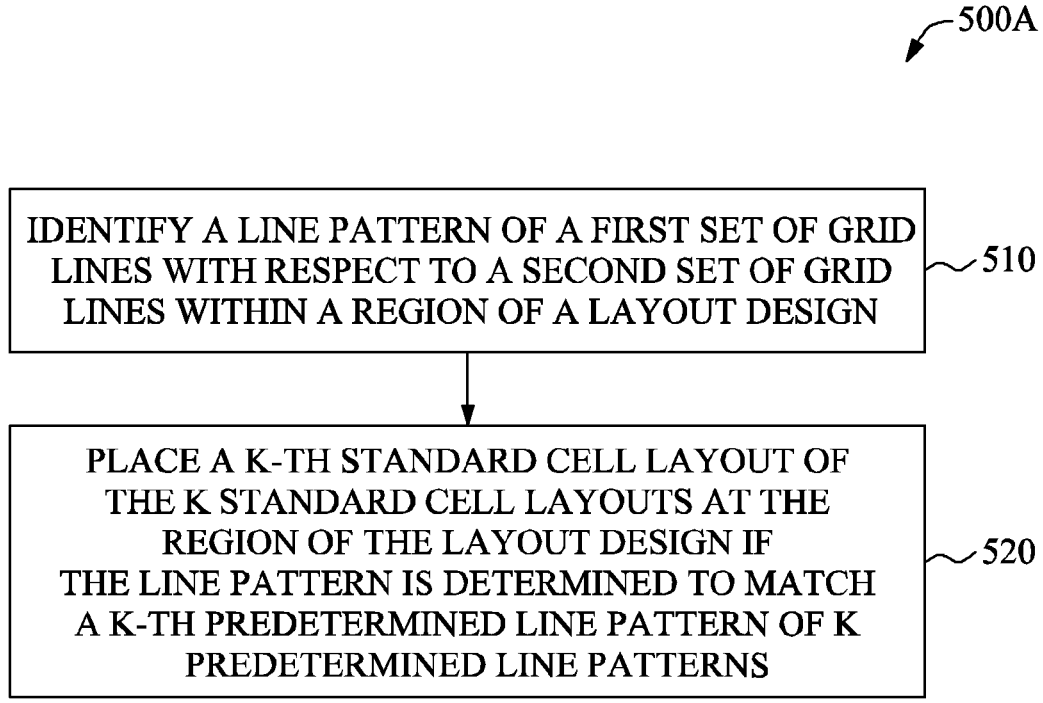
FIG. 5A is a flow chart of a method of forming a layout design in accordance with some embodiments.

FIG. 5A is a flow chart of a method 500A of forming a layout design, in accordance with some embodiments. It is understood that additional operations may be performed before, during, and/or after the method 500A depicted in FIG. 5A, and that some other processes may only be briefly described herein. In some embodiments, the method 500A is usable to form layout designs, such as layout design 100 and/or 300 in FIGS. 1 and 3.

The method begins with operation 510, where a line pattern of a first set of grid lines with respect to a second set of grid lines within a region of the layout design is identified. For example, a region corresponding to standard cell layout 110 or 120 in FIG. 1 or standard cell layout 310 or 320 in FIG. 3 are analyzed to determine a line pattern of grid lines 140a-140j versus grid lines 150a-150p or grid lines 340 versus grid lines 350.

As illustrated in conjunction with FIGS. 1 and 3, the first set of grid lines, such as grid lines 140a-140j extending along a direction Y or grid lines 340 extending along a direction X, corresponds to placement of a first set of layout patterns of a first layout layer of the layout design. The second set of grid lines, such as grid lines 150a-150p extending along direction Y or grid lines 350 extending along direction X, corresponds to placement of a second set of layout patterns of a second layout layer of the layout design. The region of the layout design is sized to fit one of K different standard cell layouts corresponding to a same standard cell functionality. K is an integer equal to or greater than two and corresponds to K10 in FIG. 1 or K30 in FIG. 3.

The first set of grid lines has a first line pitch Pt12 or Pt32, and the second set of grid lines has a second line pitch Pt32 or Pt34. As illustrated in conjunction with FIGS. 1 and 3, a ratio of the first line pitch to the second line pitch is set to be M:N, where M and N are positive integers. Therefore, value K is determinable according to the equation:

$$K = \frac{L}{M},$$

where L is a least common multiple of M and N. In some embodiments, the first pitch is greater than the second pitch, and thus M is greater than N. In some embodiments, M and N correspond to M10 and N10 illustrated in conjunction with FIG. 1 or M30 and N30 illustrated in conjunction with FIG. 3.

In some embodiments, the K predetermined line patterns includes a common placement for the first set of grid lines having and K different placements for the second set of grid lines. For example, the placement of grid lines 140a-140j in standard cell layout 110 and 120 and 130 are all the same, but the placement of grid lines 150b-150o in standard cell layout 110 and 120 and 130 corresponds to two different arrangements, where standard cell layouts 110 and 130 has a first type of arrangement, and standard cell layout 120 has the other type of arrangement.

The method proceeds to operation 520, where a k-th standard cell layout of the K standard cell layouts is placed at the region of the layout design if the line pattern is determined to match a k-th predetermined line pattern of K predetermined line patterns. The index "k" is an order index ranging from 1 to K. In some embodiments, the number K and the order index "k" correspond to K10 and k10 illustrated in conjunction with FIG. 1 or K30 and k30 illustrated in conjunction with FIG. 3. In some embodiments, K is determinable based on the equation:

$$K = \frac{L}{M},$$

where L is a least common multiple of M and N.

In the resulting integrated circuit manufactured according to the layout design generated based on method 500A, the first set of components at the first component layer are aligned with the first set of grid lines and having center-to-center pitch corresponding to line pitch of the first set of grid lines. Also, in the resulting integrated circuit, the second set of components at the second component layer are aligned with the second set of grid lines and having center-to-center pitch corresponding to line pitch of the second set of grid lines. In some embodiments, K different standard cell layouts corresponding to the same functionality are used, and thus the resulting integrated circuit includes at least K standard cells corresponding to the K different standard cell layouts. In some embodiments, the K different standard cells have a common placement for the first set of grid lines and K different placements for the second set of grid lines.

Figure 5B:
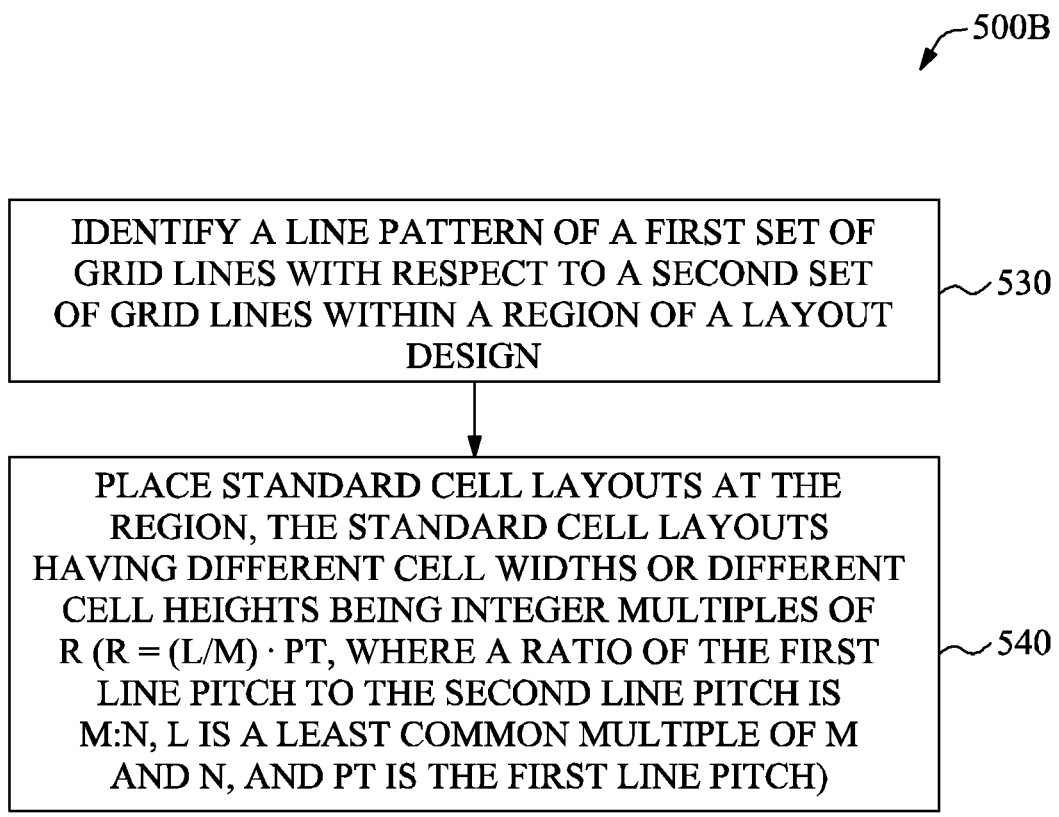
FIG. 5B is a flow chart of another method of forming a layout design in accordance with some embodiments.

FIG. 5B is a flow chart of another method 500B of forming a layout design, in accordance with some embodiments. It is understood that additional operations may be performed before, during, and/or after the method 500B depicted in FIG. 5B, and that some other processes may only be briefly described herein. In some embodiments, the method 500B is usable to form layout designs, such as layout design 200 and/or 400 in FIGS. 2 and 4.

The method begins with operation 530, where a line pattern of a first set of grid lines with respect to a second set of grid lines within a region of the layout design is identified. For example, a region corresponding to standard cell layout 210, 220, or 230 in FIG. 2 or standard cell layout 410, 420, or 430 in FIG. 4 are analyzed to determine a line pattern of grid lines 240 versus grid lines 250 or grid lines 440 versus grid lines 450. In some embodiments, it is identified in operation 530 that a ratio of the first line pitch, such as pitch Pt22 or Pt42, to the second line pitch, such as pitch Pt24 or Pt44, is M:N, where M and N correspond to M20 and N20 illustrated in conjunction with FIG. 2 or M40 and N40 illustrated in conjunction with FIG. 4.

The method proceeds to operation 540, where a plurality of standard cell layouta is placed at the region of the layout design. The plurality of standard cell layouts has different cell widths measurable along a second direction or different cell heights measurable along the second direction. In some embodiments, the plurality of standard cell layouts corresponds to standard cell layouts 210, 220, or 230 in FIG. 2 or 410, 420, and 430 in FIG. 4. The cell widths or the cell heights of the plurality of standard cell layouts are integer multiples of R determinable based on the equation:

$$R = \frac{L}{M} \cdot Pt,$$

where L is a least common multiple of M and N, and Pt is the first line pitch.

In the resulting integrated circuit manufactured according to the layout design generated based on method 500B, the first set of components at the first component layer are aligned with the first set of grid lines and having center-to-center pitch corresponding to line pitch of the first set of grid lines. Also, in the resulting integrated circuit, the second set of components at the second component layer are aligned with the second set of grid lines and having center-to-center pitch corresponding to line pitch of the second set of grid lines.

For method 500A and 500B, in some embodiments, the first component layer and the second component layer each correspond to a different one of the following component layers of the integrated circuit: a gate structure layer; a first conductive layer over the gate structure layer; and a second conductive layer over the first conductive layer.

For method 500A and 500B, in some embodiments, the first component layer and the second component layer each correspond to a different one of the following component layers of the integrated circuit: a fin structure layer for FinFETs; a first conductive layer over the fin structure layer; and a second conductive layer over the first conductive layer.

Figure 6:
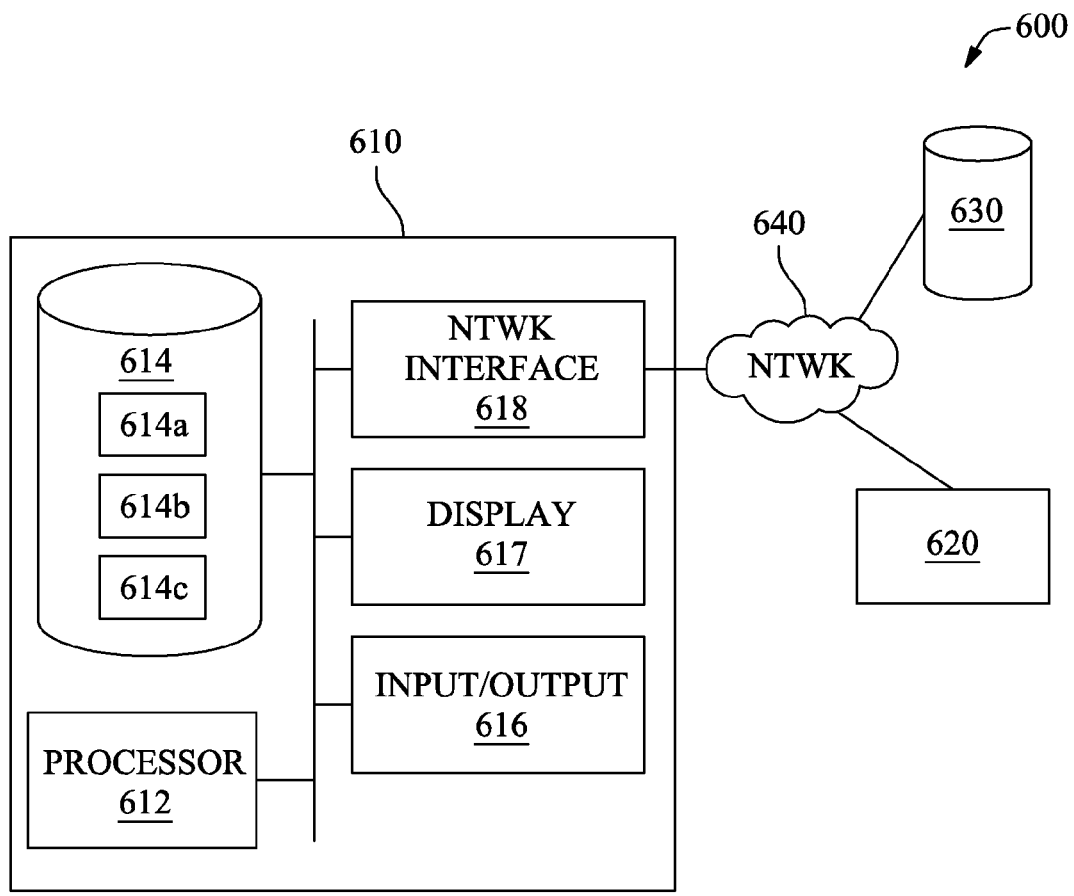
FIG. 6 is a block diagram of a system of forming a layout design in accordance with some embodiments.

FIG. 6 is a functional block diagram of a system 600 of forming a layout design in accordance with some embodiments. System 600 is usable for implementing one or more operations of the method 500A and method 500B disclosed in FIGS. 5A and 5B, and further explained in conjunction with FIGS. 1-4.

System 600 includes a first computer system 610, a second computer system 620, a networked storage device 630, and a network 640 connecting the first computer system 610, the second computer system 620, and the networked storage device 630. In some embodiments, one or more of the second computer system 620, the storage device 630, and the network 640 are omitted.

The first computer system 610 includes a hardware processor 612 communicatively coupled with a non-transitory, computer readable storage medium 614 encoded with, i.e., storing, a set of instructions 614a, a layout design 614b, or any intermediate data 614c for executing the set of instructions 614a. The processor 612 is electrically and communicatively coupled with the computer readable storage medium 614. The processor 612 is configured to execute the set of instructions 614a encoded in the computer readable storage medium 614 in order to cause the computer 610 to be usable as a layout designing tool for performing a method 500A as described in conjunction with FIG. 5A and/or for performing a method 500B as described in conjunction with FIG. 5B.

In some embodiments, the set of instructions 614a, the layout design 614b, or the intermediate data 614c are stored in a non-transitory storage medium other than storage medium 614. In some embodiments, some or all of the set of instructions 614a, the layout design 614b, or the intermediate data 614c are stored in a non-transitory storage medium in networked storage device 630 or second computer system 620. In such case, some or all of the set of instructions 614a, the layout design 614b, or the intermediate data 614c stored outside computer 610 is accessible by the processor 612 through the network 640.

In some embodiments, the processor 612 is a central processing unit (CPU), a multi-processor, a distributed processing system, an application specific integrated circuit (ASIC), and/or a suitable processing unit.

In some embodiments, the computer readable storage medium 614 is an electronic, magnetic, optical, electromagnetic, infrared, and/or a semiconductor system (or apparatus or device). For example, the computer readable storage medium 614 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 614 includes a compact disk-read only memory (CD-ROM), a compact disk-read/write (CD-R/W), and/or a digital video disc (DVD).

The computer system 610 includes, in at least some embodiments, an input/output interface 616 and a display unit 617. The input/output interface 616 is coupled to the processor 612 and allows the circuit designer to manipulate the first computer system 610. In at least some embodiments, the display unit 617 displays the status of executing the set of instructions 614a and, in at least some embodiments, provides a Graphical User Interface (GUI). In at least some embodiments, the display unit 617 displays the status of executing the set of instructions 614a in a real time manner. In at least some embodiments, the input/output interface 616 and the display 617 allow an operator to operate the computer system 610 in an interactive manner.

In at least some embodiments, the computer system 600 also includes a network interface 618 coupled to the processor 612. The network interface 618 allows the computer system 610 to communicate with the network 640, to which one or more other computer systems are connected. The network interface includes wireless network interfaces such as BLUETOOTH, WIFI, WIMAX, GPRS, or WCDMA; or wired network interface such as ETHERNET, USB, or IEEE-1394.

In accordance with one embodiment, a method of forming a layout design for fabricating an integrated circuit is disclosed. The method includes identifying a line pattern of a first set of grid lines with respect to a second set of grid lines within a region of the layout design; and placing a k-th standard cell layout of the K standard cell layouts at the region of the layout design if the line pattern is determined to match a k-th predetermined line pattern of K predetermined line patterns. K is an integer equal to or greater than two, and k is an order index ranging from 1 to K. The region of the layout design is sized to fit one of K different standard cell layouts corresponding to a same standard cell functionality. The first set of grid lines extends along a first direction and corresponding to placement of a first set of layout patterns of a first layout layer of the layout design. The second set of grid lines extends along the first direction and corresponding to placement of a second set of layout patterns of a second layout layer of the layout design. The first set of grid lines has a first line pitch, and the second set of grid lines has a second line pitch different from the first line pitch. At least one of the above operations is performed by a hardware processor.

In accordance with one embodiment, a method of forming a layout design for fabricating an integrated circuit is disclosed. The method includes identifying a line pattern of a first set of grid lines with respect to a second set of grid lines within a region of the layout design; and placing a plurality of standard cell layouts at the region of the layout design. The first set of grid lines extends along a first direction and corresponding to placement of a first set of layout patterns of a first layout layer of the layout design. The second set of grid lines extends along the first direction and corresponding to placement of a second set of layout patterns of a second layout layer of the layout design. The first set of grid lines has a first line pitch, and the second set of grid lines has a second line pitch different from the first line pitch. The plurality of standard cell layouts has different cell widths measurable along a second direction or has different cell heights measurable along the second direction. A ratio of the first line pitch to the second line pitch is M:N, M and N being positive integers. The cell widths or the cell heights of the plurality of standard cell layouts are integer multiples of R.

$$R = \frac{L}{M} \cdot Pt,$$

where L is a least common multiple of M and N, and Pt is the first line pitch.

In accordance with another embodiment, a system of forming a layout design includes a non-transitory storage medium encoded with a set of instructions; and a hardware processor communicatively coupled with the non-transitory storage medium and configured to execute the set of instruction. The set of instruction is configured to cause the processor to identify a line pattern of a first set of grid lines with respect to a second set of grid lines within a region of a layout design, and to place a k-th standard cell layout of the K standard cell layouts at the region of the layout design if the line pattern is determined to match a k-th predetermined line pattern of K predetermined line patterns. K is an integer equal to or greater than two, and k is an order index ranging from 1 to K. The region of the layout design is sized to fit one of K different standard cell layouts corresponding to a same standard cell functionality. The first set of grid lines extends along a first direction and corresponding to placement of a first set of layout patterns of a first layout layer of the layout design. The second set of grid lines extends along the first direction and corresponding to placement of a second set of layout patterns of a second layout layer of the layout design. The first set of grid lines has a first line pitch, and the second set of grid lines has a second line pitch different from the first line pitch.

In accordance with another embodiment, a system of forming a layout design includes a non-transitory storage medium encoded with a set of instructions; and a hardware processor communicatively coupled with the non-transitory storage medium and configured to execute the set of instruction. The set of instruction is configured to cause the processor to identify a line pattern of a first set of grid lines with respect to a second set of grid lines within a region of a layout design, and to place a plurality of standard cell layouts at the region of the layout design. The first set of grid lines extends along a first direction and corresponding to placement of a first set of layout patterns of a first layout layer of the layout design. The second set of grid lines extends along the first direction and corresponding to placement of a second set of layout patterns of a second layout layer of the layout design. The first set of grid lines has a first line pitch, and the second set of grid lines has a second line pitch different from the first line pitch. The plurality of standard cell layouts has different cell widths measurable along a second direction or has different cell heights measurable along the second direction. A ratio of the first line pitch to the second line pitch is M:N, M and N being positive integers. The cell widths or the cell heights of the plurality of standard cell layouts are integer multiples of R.

$$R = \frac{L}{M} \cdot Pt,$$

where L is a least common multiple of M and N, and Pt is the first line pitch.

In accordance with another embodiment, an integrated circuit includes K different standard cells corresponding to a same standard cell functionality, where K is a integer equal to or greater than two. A k-th standard cell of the K different standard cells includes a first set of components at a first component layer extending along a first direction; and a second set of components at a second component layer extending along the first direction. Index k is an order index ranging from 1 to K. The first set of components is aligned with one or more of a first set of grid lines, where the first set of grid lines has a first line pitch. The second set of components is aligned with one or more of a second set of grid lines, where the second set of grid lines has a second line pitch different from the first line pitch. The K different standard cells have a same placement for the first set of grid lines. The K different standard cells have K different placements for the second set of grid lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a layout design for fabricating an integrated circuit, the method comprising:
identifying a line pattern of a first set of grid lines with respect to a second set of grid lines within a region of the layout design, the region of the layout design being sized to fit one of K different standard cell layouts corresponding to a same standard cell functionality, K being an integer equal to or greater than two, the first set of grid lines extending along a first direction and corresponding to placement of a first set of layout patterns of a first layout layer of the layout design, the second set of grid lines extending along the first direction and corresponding to placement of a second set of layout patterns of a second layout layer of the layout design, the first set of grid lines having a first line pitch, and the second set of grid lines having a second line pitch different from the first line pitch,
wherein the line pattern includes a layout pattern aligned with a grid line of the first set of grid lines overlapping a layout pattern aligned with a grid line of the second set of grid lines; and
placing a k-th standard cell layout of the K standard cell layouts at the region of the layout design if the line pattern is determined to match a k-th predetermined line pattern of K predetermined line patterns, k being an order index ranging from 1 to K, and
at least one of the above operations being performed by a hardware processor.

2. The method of claim 1, wherein
a ratio of the first line pitch to the second line pitch is M:N, M and N being positive integers;
two cell boundaries of the k-th standard cell layout overlap two corresponding grid lines of the first set of grid lines; and $$K = \frac{L}{M},$$

L being a least common multiple of M and N.

3. The method of claim 1, wherein the placing the k-th standard cell layout of the K standard cell layouts is performed in a manner such that two cell boundaries of the k-th standard cell layout overlap two corresponding grid lines of the first set of grid lines.

4. The method of claim 1, wherein the first line pitch is greater than the second line pitch.

5. The method of claim 1, wherein the K predetermined line patterns comprise:
a same placement for the first set of grid lines; and
K different placements for the second set of grid lines.

6. The method of claim 1, wherein
the first layout layer corresponds to fabricating a first component layer of the integrated circuit;
the second layout layer corresponds to fabricating a second component layer of the integrated circuit; and
the first component layer and the second component layer each correspond to a different one of the following component layers of the integrated circuit:
a gate structure layer;
a first conductive layer over the gate structure layer; and
a second conductive layer over the first conductive layer.

7. The method of claim 1, wherein
the first layout layer corresponds to fabricating a first component layer of the integrated circuit;
the second layout layer corresponds to fabricating a second component layer of the integrated circuit; and
the first component layer and the second component layer each correspond to a different one of the following component layers of the integrated circuit:
a fin structure layer for FinFETs;
a first conductive layer over the fin structure layer; and
a second conductive layer over the first conductive layer.

8. A method of forming a layout design for fabricating an integrated circuit, the method comprising:
identifying a line pattern of a first set of grid lines with respect to a second set of grid lines within a region of the layout design, the first set of grid lines extending along a first direction and corresponding to placement of a first set of layout patterns of a first layout layer of the layout design, the second set of grid lines extending along the first direction and corresponding to placement of a second set of layout patterns of a second layout layer of the layout design, the first set of grid lines having a first line pitch, and the second set of grid lines having a second line pitch different from the first line pitch; and
placing a plurality of standard cell layouts at the region of the layout design, the plurality of standard cell layouts having different cell widths measurable along a second direction or having different cell heights measurable along the second direction, wherein
a ratio of the first line pitch to the second line pitch is M:N, M and N being positive integers;
the cell widths or the cell heights of the plurality of standard cell layouts are integer multiples of R;

$$R = \frac{L}{M} \cdot Pt,$$

L being a least common multiple of M and N, and Pt being the first line pitch;
a standard cell layout of the plurality of standard cell layouts includes a layout pattern aligned with a grid line of the first set of grid lines overlapping a layout pattern aligned with a grid line of the second set of grid lines; and
at least one of the above operations is performed by a hardware processor.

9. The method of claim 8, wherein the first pitch is greater than the second pitch.

10. The method of claim 8, wherein
the first layout layer corresponds to fabricating a first component layer of the integrated circuit;
the second layout layer corresponds to fabricating a second component layer of the integrated circuit; and
the first component layer and the second component layer each correspond to a different one of the following component layers of the integrated circuit:
a gate structure layer;
a first conductive layer over the gate structure layer; and
a second conductive layer over the first conductive layer.

11. The method of claim 8, wherein
the first layout layer corresponds to fabricating a first component layer of the integrated circuit;
the second layout layer corresponds to fabricating a second component layer of the integrated circuit; and
the first component layer and the second component layer each correspond to a different one of the following component layers of the integrated circuit:
a fin structure layer for FinFETs;
a first conductive layer over the fin structure layer; and
a second conductive layer over the first conductive layer.

12. A system of forming a layout design, comprising:
a non-transitory storage medium encoded with a set of instructions; and
a hardware processor communicatively coupled with the non-transitory storage medium and configured to execute the set of instruction, the set of instruction being configured to cause the processor to:
identify a line pattern of a first set of grid lines with respect to a second set of grid lines within a region of a layout design, the region of the layout design being sized to fit one of K different standard cell layouts corresponding to a same standard cell functionality, K being an integer equal to or greater than two, the first set of grid lines extending along a first direction and corresponding to placement of a first set of layout patterns of a first layout layer of the layout design, the second set of grid lines extending along the first direction and corresponding to placement of a second set of layout patterns of a second layout layer of the layout design, the first set of grid lines having a first line pitch, and the second set of grid lines having a second line pitch different from the first line pitch,
wherein the line pattern includes a layout pattern aligned with a grid line of the first set of grid lines overlapping a layout pattern aligned with a grid line of the second set of grid lines at a location other than a cell boundary; and
place a k-th standard cell layout of the K standard cell layouts at the region of the layout design if the line pattern is determined to match a k-th predetermined line pattern of K predetermined line patterns, k being an order index ranging from 1 to K.

13. The system of claim 12, wherein
a ratio of the first line pitch to the second line pitch is M:N, M and N being positive integers;
two cell boundaries of the k-th standard cell layout overlap two corresponding grid lines of the first set of grid lines; and $$K = \frac{L}{M},$$

L being a least common multiple of M and N.

14. The system of claim 12, wherein the placing the k-th standard cell layout of the K standard cell layouts is performed in a manner such that two cell boundaries of the k-th standard cell layout overlap two corresponding grid lines of the first set of grid lines.

15. The system of claim 12, wherein the K predetermined line patterns comprise:
a same placement for the first set of grid lines; and
K different placements for the second set of grid lines.

16. The system of claim 12, wherein
the first layout layer corresponds to fabricating a first component layer of the integrated circuit;
the second layout layer corresponds to fabricating a second component layer of the integrated circuit; and
the first component layer and the second component layer each correspond to a different one of the following component layers of the integrated circuit:
a gate structure layer;
a first conductive layer over the gate structure layer; and
a second conductive layer over the first conductive layer.

17. The system of claim 12, wherein
the first layout layer corresponds to fabricating a first component layer of the integrated circuit;
the second layout layer corresponds to fabricating a second component layer of the integrated circuit; and
the first component layer and the second component layer each correspond to a different one of the following component layers of the integrated circuit:
a fin structure layer for FinFETs;
a first conductive layer over the fin structure layer; and
a second conductive layer over the first conductive layer.

18. A system of forming a layout design, comprising:
a non-transitory storage medium encoded with a set of instructions; and
a hardware processor communicatively coupled with the non-transitory storage medium and configured to execute the set of instruction, the set of instruction being configured to cause the processor to:
identify a line pattern of a first set of grid lines with respect to a second set of grid lines within a region of the layout design, the first set of grid lines extending along a first direction and corresponding to placement of a first set of layout patterns of a first layout layer of the layout design, the second set of grid lines extending along the first direction and corresponding to placement of a second set of layout patterns of a second layout layer of the layout design, the first set of grid lines having a first line pitch, and the second set of grid lines having a second line pitch different from the first line pitch; and
place a plurality of standard cell layouts at the region of the layout design, the plurality of standard cell layouts having different cell widths measurable along a second direction or having different cell heights measurable along the second direction, wherein
a ratio of the first line pitch to the second line pitch is M:N, M and N being positive integers;
the cell widths or the cell heights of the plurality of standard cell layouts are integer multiples of R;

$$R = \frac{L}{M} \cdot Pt,$$

L multiple of M and N, and Pt being the first line pitch; and
a standard cell layout of the plurality of standard cell layouts includes a layout pattern aligned with a grid line of the first set of grid lines overlapping a layout pattern aligned with a grid line of the second set of grid lines at a location other than a boundary of the standard cell layout.

19. The system of claim 18, wherein
the first layout layer corresponds to fabricating a first component layer of the integrated circuit;
the second layout layer corresponds to fabricating a second component layer of the integrated circuit; and
the first component layer and the second component layer each correspond to a different one of the following component layers of the integrated circuit:
a gate structure layer;
a first conductive layer over the gate structure layer; and
a second conductive layer over the first conductive layer.

20. The system of claim 18, wherein
the first layout layer corresponds to fabricating a first component layer of the integrated circuit;
the second layout layer corresponds to fabricating a second component layer of the integrated circuit; and
the first component layer and the second component layer each correspond to a different one of the following component layers of the integrated circuit:
a fin structure layer for FinFETs;
a first conductive layer over the fin structure layer; and
a second conductive layer over the first conductive layer.

* * * * *